(12) United States Patent
Tamura et al.

(10) Patent No.: US 8,063,007 B2
(45) Date of Patent: Nov. 22, 2011

(54) REMOVING AGENT COMPOSITION AND REMOVING/CLEANING METHOD USING SAME

(75) Inventors: Atsushi Tamura, Wakayama (JP); Yasuhiro Doi, Wakayama (JP)

(73) Assignee: Kao Corporation, Tokyo (JP)

( * ) Notice: Subject to any disclaimer, the term of this patent is extended or adjusted under 35 U.S.C. 154(b) by 218 days.

(21) Appl. No.: 12/481,878

(22) Filed: Jun. 10, 2009

(65) Prior Publication Data

US 2009/0247447 A1 Oct. 1, 2009

Related U.S. Application Data

(62) Division of application No. 10/557,608, filed as application No. PCT/JP2004/008162 on Jun. 4, 2004, now abandoned.

(30) Foreign Application Priority Data

| Jun. 4, 2003 | (JP) | 2003-159896 |
|---|---|---|
| Aug. 8, 2003 | (JP) | 2003-290711 |
| Nov. 14, 2003 | (JP) | 2003-385788 |
| Nov. 14, 2003 | (JP) | 2003-385795 |

(51) Int. Cl.
*H01L 21/02* (2006.01)
(52) U.S. Cl. .......................... 510/175; 134/1.3
(58) Field of Classification Search .................. 510/175; 134/1.3
See application file for complete search history.

(56) References Cited

U.S. PATENT DOCUMENTS

| 5,575,920 A | 11/1996 | Freese et al. |
|---|---|---|
| 5,972,862 A | 10/1999 | Torii et al. |
| 5,983,268 A | 11/1999 | Freivald et al. |
| 5,997,658 A | 12/1999 | Peters et al. |
| 6,033,993 A * | 3/2000 | Love et al. .................... 438/745 |
| 6,080,709 A | 6/2000 | Ishikawa et al. |
| 6,278,448 B1 | 8/2001 | Brown et al. |
| 6,620,216 B2 | 9/2003 | Oshima et al. |
| 6,824,794 B2 | 11/2004 | Ring et al. |
| 6,976,905 B1 | 12/2005 | Fang et al. |
| 7,396,806 B2 | 7/2008 | Sakai et al. |
| 2003/0143495 A1* | 7/2003 | Ishikawa et al. .............. 430/329 |
| 2005/0040139 A1* | 2/2005 | Gonzalez et al. ................ 216/83 |
| 2005/0143271 A1* | 6/2005 | Tamura et al. ................ 510/175 |

FOREIGN PATENT DOCUMENTS

| JP | 2000-267302 A | 9/2000 |
|---|---|---|
| JP | 2002-162755 A | 6/2002 |
| JP | 2003-017458 | 1/2003 |
| JP | 2004-94203 A | 3/2004 |
| JP | 2004-133384 A | 4/2004 |

OTHER PUBLICATIONS

English Language Abstract of JP 2002-162755 A (Jun. 7, 2002).
English Language Abstract of JP 2004-94203 A (Mar. 25, 2004).
English Language Abstract of JP 2004-133384 A (Apr. 30, 2004).

* cited by examiner

*Primary Examiner* — Gregory Webb
(74) *Attorney, Agent, or Firm* — Birch, Stewart, Kolasch & Birch, LLP

(57) ABSTRACT

The present invention relates to a removal cleaning method for a semiconductor substrate or a semiconductor device with metal wirings by using a remover composition, wherein the remover composition contains a dissolution agent having an alumina dissolution amount as measured according to the standard test (A-1) of 10 ppm or more, and an inhibitor having an aluminum etching amount as measured according to the standard test (B-1) of 7 nm or less, and the remover composition substantially does not contain a fluorine-containing compound; a method of producing a semiconductor substrate or a semiconductor device, including the step involving the removal cleaning method; and a remover composition containing a specified acid, and a specified inorganic acid salt and/or organic acid salt. The removal cleaning method and the remover composition of the present invention can be suitably used for producing even higher-speed, even more highly integrated and high quality electronic parts such as LCDs, memories and CPUs, particularly for cleaning a semiconductor substrate or a semiconductor device in which a wiring material containing aluminum and/or titanium is used.

17 Claims, No Drawings

REMOVING AGENT COMPOSITION AND REMOVING/CLEANING METHOD USING SAME

This application is a Divisional of application Ser. No. 10/557,608 filed on Nov. 22, 2005 now abandoned, for which priority is claimed under 35 U.S.C. §120. Application Ser. No. 10/557,608 is the national phase of PCT International Application No. PCT/JP2004/008162 filed on Jun. 4, 2004 under 35 U.S.C. §371, which claims priority on JP 2003-159896 filed Jun. 4, 2003; JP 2003-290711 filed Aug. 8, 2003; JP 2003-385788 filed Nov. 14, 2003 and JP 2003-385795 filed Nov. 14, 2003.

FIELD OF THE INVENTION

The present invention relates to a removal cleaning method, in which "deposition" (oxide products originated from metal materials, and the like), which remain after removing by ashing the resist used in a step of forming a semiconductor device on a semiconductor substrate such as a silicon wafer, are removed from the semiconductor substrate or the semiconductor device with metal wirings; a method of producing a semiconductor substrate or a semiconductor device by using the removal cleaning method; and a remover composition.

The present invention also relates to a remover composition for removing deposition which remain after removing by ashing the resist used in a step of forming a semiconductor device on a semiconductor substrate such as a silicon wafer; a method of cleaning a semiconductor by using the remover composition; and a method of producing a semiconductor substrate or a semiconductor device, including the step of cleaning by removing deposition by using the remover composition.

BACKGROUND ART

In the production of semiconductor devices, a thin film is formed by using a method such as sputtering, and a predetermined pattern is formed on the thin film with a resist by lithography. Based on this pattern as an etching resist, the underlying thin film is selectively removed by etching, followed by a step of removing the resist by ashing. Thereafter, a step of removing the remaining deposition by using a remover is required.

As removers for conventional semiconductor devices with aluminum wirings, various remover compositions have been proposed, and removers in which a fluorine-containing compound is used, and removers in which an amine represented by hydroxylamine is used, have been mainly used.

However, with increasing demands for higher-speed and more highly integrated semiconductor devices, the wirings are finer and the wiring width is narrower, so that it has been an essential requirement to prevent occurrence of wiring corrosion (etching) by a remover during cleaning.

JP-A-Hei-10-55993 discloses, as a cleaning agent which does not corrode metal film, a remover composition composed of a quaternary ammonium salt or an organic ammonium carboxylate, ammonium fluoride, a water-soluble organic solvent, and an inorganic acid or an organic acid. This remover composition is effective for use in conventional devices with wirings of a wide wiring width. However, this remover composition has a problem with use in devices with wirings of a narrow wiring width, because ammonium fluoride is highly corrosive to aluminum wirings.

Also, JP 2000-267302 A discloses a remover composition containing a combination of an organic acid and a surfactant (an organic sulfate, a sulfonate, a fatty acid salt, and the like), but this remover composition has low deposition-removing power. When the amount of the organic acid is increased to improve deposition eliminability, corrosion of aluminum wirings occurs, so that a sufficient effect is not obtained. Therefore, to date, no remover composition has been obtained which satisfies both of deposition eliminability and low corrosiveness to aluminum wirings, which are required for devices with wirings of a narrow wiring width.

On the other hand, when via holes which connect wirings are formed, there is also an increasing tendency that a large quantity of titanium-based deposition is adhered, due to narrower wiring width, during etching of the titanium or titanium nitride on the bottom of the via holes. Further, these titanium-based depositions are solidified in the subsequent ashing step, which makes the removal cleaning of deposition very difficult. Therefore, a sufficient removability is not obtained even when a fluorine-containing compound-based remover or an amine-based remover is used for the removing.

In view of the above problem, there are proposed a remover containing hydrogen peroxide, a quaternary ammonium salt and a hydrogen peroxide compound (JP 2002-202618 A), a remover which contains hydrogen peroxide, a quaternary ammonium salt and an anticorrosive and is used under alkaline conditions (JP 2003-5383 A), and the like. However, these removers require removal cleaning to be done under high-temperature conditions, and the removability of titanium-based deposition is still insufficient. Consequently, these removers have not solved the problem.

Further, in an attempt to clean by using an aqueous cleaning agent containing a combination of an organic acid and water or a combination of an organic acid, a water-soluble solvent and water, as described in JP-A-Hei-10-256210 and JP-A-Hei-11-316464, there arises problems such as deposition eliminability is decreased and the anticorrosiveness for aluminum wirings is deteriorated, as compared with the initial cleaning stage, as a continuous cleaning is proceeded. Therefore, practically, a continuous cleaning cannot be performed for a long period of time, and the remover, when used, needs to be replaced with a new one in a short period of time.

On the other hand, in a system of phosphoric acid and ammonium phosphate as described in JP 2000-232063 A, and a system of ammonium fluoride, an acid and an organic ammonium carboxylate as described in JP-A-Hei-10-55993, though a change in cleaning performance with continuous cleaning is small, deposition dissolution and anticorrosiveness for aluminum wirings, which are the basic properties, cannot be attained sufficiently at the same time from the initial stage of cleaning.

In addition, each of JP-A-Hei-9-279189 and JP 2001-26890 A discloses an aqueous cleaning agent used for cleaning semiconductors. However, both of the cleaning agents insufficiently satisfy deposition eliminability and anticorrosiveness for aluminum wirings at the same time.

Particularly, it is difficult to use these conventionally known aqueous removers in semiconductor substrates and semiconductor devices with wirings having a narrow wiring width of 180 nm or less, which is required for higher-speed and more highly integrated semiconductors in the future.

Also, when conventionally known aqueous removers are used in an open-topped cleaning vessel for a long period of time, or used in a circulation system, there is a problem that semiconductor substrates and the like are contaminated over time. In a practical situation, a remover is replaced with a new one in a short period of time to deal with this problem.

SUMMARY OF THE INVENTION

Specifically, the gist of the present invention relates to:

[1] a removal cleaning method for a semiconductor substrate or a semiconductor device with metal wirings by using a remover composition, wherein the remover composition contains a dissolution agent having an alumina dissolution amount as measured according to the standard test (A-1) of 10 ppm or more, and an inhibitor having an aluminum etching amount as measured according to the standard test (B-1) of 7 nm or less, and the remover composition substantially does not contain a fluorine-containing compound;

[2] the removal cleaning method for a semiconductor substrate or a semiconductor device of the above [1], wherein the dissolution agent is an acid;

[3] the removal cleaning method for a semiconductor substrate or a semiconductor device of the above [1] or [2], wherein the inhibitor is an inorganic acid salt and/or an organic acid salt;

[4] the removal cleaning method for a semiconductor substrate or a semiconductor device of any one of the above [1] to [3], wherein the inhibitor is one or more salts selected from the group consisting of carboxylates, sulfates, sulfonates, phosphonates, nitrates, hydrochlorides and borates;

[5] the removal cleaning method for a semiconductor substrate or a semiconductor device of any one of the above [1] to [4], wherein a weight ratio of the dissolution agent to the inhibitor (dissolution agent/inhibitor) is 2/1 to 1/30;

[6] the removal cleaning method for a semiconductor substrate or a semiconductor device of any one of the above [1] to [5], wherein the remover composition contains 50% by weight or more of water and has a pH of 1 to 10;

[7] the removal cleaning method for a semiconductor substrate or a semiconductor device of any one of the above [1] to [6], wherein the metal wirings include aluminum wirings having a wiring width of 180 nm or less;

[8] a removal cleaning method for a semiconductor substrate or a semiconductor device with metal wirings having a wiring width of 180 nm or less by using a remover composition, wherein the remover composition contains a dissolution agent having an alumina dissolution amount as measured according to the standard test (A-1) of 10 ppm or more, and an inhibitor having an aluminum etching amount as measured according to the standard test (B-1) of 7 nm or less;

[9] the removal cleaning method for a semiconductor substrate or a semiconductor device of any one of the above [1] to [8], wherein the metal wirings are metal wirings containing one or more metals selected from the group consisting of aluminum, copper, tungsten and titanium;

[10] a method of producing a semiconductor substrate or a semiconductor device, including the step involving the removal cleaning method for a semiconductor substrate or a semiconductor device as defined in any one of the above [1] to [9];

[11] a remover composition containing an acid, and an inorganic acid salt and/or an organic acid salt, wherein the acid, and the inorganic acid salt and/or the organic acid salt are any one of the following (i) to (v):

(i) the acid is 1-hydroxyethylidene-1,1-diphosphonic acid, and the inorganic acid salt and/or the organic acid salt is one or more salts selected from the group consisting of carboxylates, sulfates, sulfonates, phosphonates, nitrates, hydrochlorides and borates;

(ii) the acid is sulfuric acid, and the inorganic acid salt is a sulfate and/or a nitrite;

(iii) the acid is oxalic acid, and the inorganic acid salt is a phosphonate;

(iv) the acid comprises sulfuric acid and oxalic acid, and the inorganic acid salt is a sulfate; and (v) the acid comprises 1-hydroxyethylidene-1,1-diphosphonic acid and oxalic acid, and the inorganic acid salt is a sulfate;

[12] a remover composition, containing a) water, and b) a compound having a solubility (25° C.) in water of 10 g or more/100 g of water, wherein the content of the water a) is 50 to 99.8% by weight, and the content of the compound b) is 90% by weight or more of the portion of the remover composition excluding the water a), and the remover composition has an aluminum oxide dissolution amount as measured according to the standard test (A-2) of 10 ppm or more, and an aluminum etching amount as measured according to the standard test (B-2) of 7 nm or less;

[13] the remover composition of the above [12], wherein the remover composition contains an acid, and an inorganic acid salt and/or an organic acid salt as the compound b);

[14] the remover composition of the above [13], wherein the acid is contained in an amount of 0.01 to 5% by weight, and the inorganic acid salt and/or the organic acid salt is contained in an amount of 0.2 to 40% by weight;

[15] the remover composition of any one of the above [12] to [14], wherein the remover composition has a pH of 1 to 10;

[16] a method of cleaning a semiconductor by using the remover composition as defined in any one of the above [12] to [15];

[17] the method of cleaning a semiconductor of the above [16], wherein the semiconductor is a semiconductor with aluminum wirings having a wiring width of 180 nm or less;

[18] a method of producing a semiconductor, including the step of cleaning using the cleaning method as defined in the above [16] or [17];

[19] a water-based remover composition, containing an aluminum oxide dissolution agent and an aluminum corrosion inhibitor, wherein the water-based remover composition has: 1) a water content of 50% by weight or more; 2) an aluminum oxide dissolution amount as measured according to the standard test (A-2) of 10 ppm or more; 3) an aluminum etching amount as measured according to the standard test (B-2) of 7 nm or less; and provides 4) a pH change before and after the standard test (A-2) of 0.5 or less;

[20] the remover composition of the above [19], wherein the aluminum oxide dissolution agent is an acid, and the aluminum corrosion inhibitor is an inorganic acid salt and/or an organic acid salt;

[21] the remover composition of the above [19] or [20], wherein the remover composition has a pH of 1 to 10;

[22] a method of continuous cleaning of a semiconductor, including the step of cleaning at 60° C. or lower, by using the remover composition as defined in any one of the above [19] to [21];

[23] the method of continuous cleaning of a semiconductor of the above [22], wherein a semiconductor substrate or a semiconductor device with aluminum wirings having a wiring width of 180 nm or less is used; and

[24] a method of producing a semiconductor, including the step of cleaning using the method of continuous cleaning as defined in the above [22] or [23].

These objects of the present invention and other objects will be apparent from the following description.

DETAILED DESCRIPTION OF THE INVENTION

A first embodiment of the present invention relates to a removal cleaning method for a semiconductor substrate or a semiconductor device with metal wirings, wherein deposition originated from aluminum wirings produced after ashing and titanium-based deposition produced during via hole formation can be removed effectively, and corrosion of aluminum wiring materials as well as titanium, titanium nitride and the like on the bottom the holes can be drastically suppressed; a method of producing a semiconductor substrate or a semiconductor device by using the removal cleaning method; and a remover composition which is excellent in deposition eliminability and capable of drastically suppressing corrosion of wirings. Particularly, this embodiment relates to a removal cleaning method for a semiconductor substrate or a semiconductor device, which is suitable for cleaning semiconductor devices with aluminum wirings having a narrow wiring width of 180 nm or less; a method of producing a semiconductor substrate or a semiconductor device by using the removal cleaning method; and a remover composition which is excellent in deposition eliminability and capable of drastically suppressing corrosion of wirings.

Also, a second embodiment of the present invention relates to a water-based remover composition which can prevent semiconductors from contamination, without corrosion of aluminum wiring materials as well as titanium, titanium nitride and the like on the bottom of the holes, during cleaning by removing deposition originated from aluminum wirings produced after ashing and titanium-based deposition produced during via hole formation; a method of cleaning by using the remover composition; and a method of producing a semiconductor substrate or a semiconductor device, including the step of cleaning by using the remover composition.

Particularly, this embodiment relates to a method of cleaning, with preventing contamination, a semiconductor substrate or a semiconductor device with aluminum wirings having a narrow wiring width of 180 nm or less, which are easily affected by contaminants; and a method of producing a semiconductor substrate or a semiconductor device, including the step of cleaning with preventing contamination.

Also, a third embodiment of the present invention relates to a remover composition which can be used continuously for a long period of time, without changing the initial performance, without corrosion of aluminum wiring materials as well as titanium, titanium nitride and the like on the bottom of the holes, during cleaning by removing deposition originated from aluminum wirings produced after ashing and titanium-based deposition produced during via hole formation using a remover composition; a method of continuous cleaning of a semiconductor such as a semiconductor substrate or a semiconductor device by using the remover composition; and a method of producing a semiconductor, including the step of cleaning by using the method of continuous cleaning.

Particularly, this embodiment relates to a remover composition which works effectively on a semiconductor with aluminum wirings having a narrow wiring width of 180 nm or less, which require high cleaning ability; a related method of continuous cleaning; and a method of producing a semiconductor.

Incidentally, all of the present inventions, as represented by these embodiments 1 to 3, are different from cleaning agents for eliminating particles produced during polishing silicon wafer substrates, and the like, and for eliminating particles and metal impurities after polishing embedded metal which connects wirings to one another (CMP polishing).

Embodiment 1

A first embodiment of the present invention is a removal cleaning method for a semiconductor substrate or a semiconductor device with metal wirings by using a remover composition, wherein the remover composition contains a dissolution agent having an alumina dissolution amount as measured according to the standard test (A-1) of 10 ppm or more and an inhibitor having an aluminum etching amount as measured according to the standard test (B-1) of 7 nm or less, and the remover composition substantially does not contain a fluorine-containing compound.

1. Remover Composition

The present inventors have found that it is highly effective to use a remover composition containing a dissolution agent having an alumina dissolution amount more than a specified value and an inhibitor having an aluminum etching amount less than a specified value, in order to improve deposition eliminability after ashing of aluminum wirings, while suppressing corrosion of aluminum wirings. Specifically, Embodiment 1 has a feature that the remover composition to be used contains a dissolution agent having an alumina dissolution amount as measured according to the standard test (A-1) of 10 ppm or more and an inhibitor having an aluminum etching amount as measured according to the standard test (B-1) of 7 nm or less. By using such a remover composition, there are exhibited effects that an excellent removability of deposition produced during production of semiconductor devices is obtained and that corrosion of materials such as wiring metals can be prevented.

Also, the remover composition has another feature that the composition substantially does not contain a fluorine-containing compound and, by this feature, the composition has an advantage of causing no problems with anticorrosiveness for wirings and waste water treatment.

Particularly, in a water-based remover composition containing, as effective components, a fluorine-containing compound, of which aqueous solution (0.2%) has an aluminum etching amount exceeding 50 nm, such as hydrogen fluoride, ammonium fluoride or an amine salt of hydrofluoric acid, when an aluminum etching test is carried out in the same manner as in the standard test (B-1), metal corrosion tends to occur more markedly with increase in the content of water. Therefore, in Embodiment 1, "substantially not containing a fluorine-containing compound" specifically means that the content of the fluorine-containing compound in the remover composition used in Embodiment 1 is 0.1% by weight or less, preferably 0.05% by weight or less, more preferably 0.01% by weight or less, and even more preferably 0.001% by weight or less. Especially preferably, no fluorine-containing compound is contained.

Incidentally, as the remover composition for a removal cleaning for a semiconductor substrate or a semiconductor device with metal wirings having a wiring width of 180 nm or less by using a remover composition, a remover composition has a sufficient effect which just contains a dissolution agent having an alumina dissolution amount as measured according to the standard test (A-1), described below, of 10 ppm or more and an inhibitor having an aluminum etching amount as measured according to the standard test (B-1) of 7 nm or less. Therefore, the present invention also relates a removal cleaning method for a semiconductor substrate or a semiconductor device with metal wirings having a wiring width of 180 nm or less by using a remover composition, wherein the remover composition contains a dissolution agent having an alumina dissolution amount as measured according to the standard test (A-1) of 10 ppm or more and an inhibitor having an aluminum etching amount as measured according to the standard test (B-1) of 7 nm or less.

The procedures of the standard test (A-1) and the standard test (B-1) will be described below.

<Standard Test (A-1)>
1) Twenty grams of a 0.2 wt % aqueous solution of a dissolution agent is placed in a 100-ml polyethylene container, and kept at a constant temperature in a thermostatic chamber at 40° C.
2) Next, 0.1 g of an alumina powder (trade name: "WA-10000," manufactured by Fujimi Corporation; average particle size: 0.5 μm) is added to the solution, and sufficiently stirred for 30 minutes.
3) Ten grams of an aliquot of the supernatant is placed in a centrifuging tube, and allowed to separate using a centrifuge (trade name: "himac CP56G," manufactured by Hitachi, Ltd.) under conditions at 20,000 r/min for 15 minutes. The light emission intensity from aluminum is determined for the resulting supernatant using an ICP emission analyzer (trade name: "JY238," manufactured by Horiba Ltd.).
4) The alumina dissolution amount is determined from a calibration curve made using an aqueous solution of aluminum of known concentrations.

Incidentally, from the viewpoint of performing the measurement more excellently, the supernatant is diluted ten-fold with ultrapure water for measuring the light emission intensity from aluminum in 3). When the concentration is over the range of the calibration curve (0 to 2 ppm), the diluted solution is again diluted ten-fold for the measurement. Also in 4), an aqueous solution of aluminum (1,000 ppm) is diluted 10,000-fold (0.1 ppm) and 500-fold (2.0 ppm), respectively, with ultrapure water, and the resulting dilutions are subjected to an atomic absorption analysis to make a calibration curve (three-point calibration).

<Standard Test (B-1)>
1) A test piece is prepared by cutting out a 3-cm square piece from a substrate having an aluminum sputtering layer (thickness: about 500 nm) formed on a silicon wafer by a CVD method.
2) A test aqueous solution is prepared in which the concentration of 1-hydroxyethylidene-1,1-diphosphonic acid ("Dequest 2010R," manufactured by Sorcia Japan Kabushiki Kaisha) is 0.2% by weight and the concentration of an inhibitor is 4.0% by weight.
3) The test piece is subjected to pre-cleaning by immersing in a 0.1 wt % aqueous HF solution at room temperature for 30 seconds, rinsing with water, and drying by blowing nitrogen. The fluorescent X-ray intensity from aluminum is measured for the resulting test piece, using a fluorescent X-ray measuring device ("ZSX100e," manufactured by Rigaku Denki Kogyo Co., Ltd.) (measurement of film thickness before immersing in the test aqueous solution).
4) Thereafter, the test piece is immersed in 20 g of the test aqueous solution kept at a constant temperature at 40° C. for 30 minutes, rinsed with ion exchange water and dried by blowing nitrogen. Then, the fluorescent X-ray intensity from aluminum is measured for the resulting test piece on the same position as that measured before immersing, using a fluorescent X-ray measuring device (measurement of film thickness after immersing in the test aqueous solution).
5) The film thicknesses before and after immersing in the test aqueous solution are calculated from the calibration curve made previously for aluminum sputtering film of known film thicknesses using a fluorescent X-ray measuring device.

The dissolution agent contained in the remover composition used in Embodiment 1 is one having an alumina dissolution amount as measured according to the above-mentioned standard test (A-1) of 10 ppm or more. It is desirable that the alumina dissolution amount is preferably 12 ppm or more, and more preferably 15 ppm or more, from the viewpoint of enhancing deposition removability after ashing.

The dissolution agent is not particularly limited, as long as it can satisfy the above requirement. It is desirable to use an acid as the dissolution agent from the viewpoint of attaining deposition removability and anticorrosiveness for wirings at the same time. Among acids, in particular, one or more acids selected from the group consisting of inorganic acids such as phosphonic acid, sulfuric acid, nitric acid, phosphoric acid and hydrochloric acid, and organic acids such as organic phosphonic acid, organic sulfuric acid, carboxylic acid and organic sulfonic acid are desirably used. Specifically, sulfuric acid, hydrochloric acid, nitric acid, methanesulfonic acid, sulfosuccinic acid, oxalic acid and 1-hydroxyethylidene-1,1-diphosphonic acid are preferable and, in particular, sulfuric acid, oxalic acid and 1-hydroxyethylidene-1,1-diphosphonic acid are preferable.

The content of the dissolution agent is preferably 0.01 to 5% by weight, more preferably 0.01 to 3% by weight, even more preferably 0.01 to 2% by weight, and especially preferably 0.05 to 2% by weight, from the viewpoint of attaining deposition removability and anticorrosiveness for wirings at the same time.

Also, the inhibitor contained in the remover composition used in Embodiment 1 has an aluminum etching amount as measured according to the standard test (B-1) of 7 nm or less. It is desirable that the aluminum etching amount is preferably 5 nm or less, and more preferably 3 nm or less, from the viewpoint of preventing corrosion of aluminum wirings. The inhibitor in the present invention is not particularly limited, as long as it can satisfy the above requirement. It is desirable to use an inorganic acid salt and/or an organic acid salt as the inhibitor. Among the salts, in particular, one or more salts selected from the group consisting of carboxylates, sulfates, sulfonates, phosphonates, nitrates, hydrochlorides and borates are desirable. Specifically included are ammonium acetate, ammonium citrate, ammonium oxalate, ammonium sulfosuccinate, ammonium sulfate, ammonium methanesulfonate, ammonium phosphonate, ammonium nitrate, ammonium chloride, ammonium tetraborate, and the like. With regard to the cations, these salts may be amine salts or quaternary ammonium salts, as well as ammonium salts. The amines are not particularly limited, as long as they are basic, and include hydroxylamines such as hydroxylamine and diethylhydroxylamine; alkylamines such as ethylamine, propanediamine, dibutylamine and trimethylamine; alkanolamines such as monoethanolamine, methylethanolamine and methyldiethanolamine; aromatic amines such as aniline and benzylamine; and the like. The quaternary ammonium ions which form a quaternary ammonium salt include tetramethylammonium ion, tetraethylammonium ion, triethylmethylammonium ion, lauryltrimethylammonium ion, benzyltrimethylammonium ion, and the like.

Among these combinations, ammonium sulfate, tetramethylammonium sulfate, methylethanolamine sulfate, methyldiethanolamine sulfate and ammonium chloride are especially preferable, and ammonium sulfate is most preferable.

The content of the inhibitor in the remover composition used in Embodiment 1 is preferably 0.2 to 40% by weight, more preferably 0.5 to 30% by weight, even more preferably 1 to 20% by weight, and especially preferably 5 to 10% by weight, from the viewpoint of anticorrosiveness for metal materials such as aluminum wirings, homogenous dissolution in water and deposition dissolubility.

The formulated weight ratio of the dissolution agent to the inhibitor (dissolution agent/inhibitor) in Embodiment 1 is preferably 2/1 to 1/30, more preferably 1/2 to 1/30, even more preferably 1/4 to 1/30, and even more preferably 1/6 to 1/25, from the viewpoint of attaining deposition removability and anticorrosiveness for wirings at the same time.

The combination of the dissolution agent and the inhibitor is properly selected from the dissolution agents and the inhibitors mentioned above, without any particular limitation. For instance, from the viewpoint of attaining deposition removability and anticorrosiveness for wirings at the same time, it is preferable that the dissolution agent is 1-hydroxyethylidene-1,1-diphosphonic acid and the inhibitor is one or more salts selected from the group consisting of carboxylates, sulfates, sulfonates, phosphonates, nitrates, hydrochlorides and borates. Among them, preferable is a combination of 1-hydroxyethylidene-1,1-diphosphonic acid and a sulfate.

Also, preferred examples include a combination of sulfuric acid and a sulfate and/or a nitrate; a combination of oxalic acid and a phosphonate; a combination of sulfuric acid, oxalic acid and a sulfate; a combination of 1-hydroxyethylidene-1,1-diphosphonic acid, oxalic acid and a sulfate; and the like.

In addition, other preferred examples include a combination of the dissolution agent selected from phosphonic acid, organic phosphonic acid and organic sulfuric acid and the inhibitor selected from a phosphonate, hydrochloride and borate.

Further, additional preferred examples include a combination of the dissolution agent selected from methanesulfonic acid and sulfosuccinic acid, and the inhibitor selected from ammonium citrate, ammonium sulfosuccinate, ammonium sulfate, ammonium methanesulfonate, ammonium phosphonate and ammonium chloride.

The remover composition used in Embodiment 1 contains water in an amount of preferably 50% by weight or more, more preferably 60 to 99.7% by weight, even more preferably 70 to 99.4% by weight, and especially preferably 90 to 99.4% by weight, from the viewpoint of stability of the composition due to highly homogenous dissolution of the dissolution agent, the inhibitor or the like, operability and environmental issues such as waste water treatment.

With respect to the pH of the above remover composition, when the pH is 1 or more, the inhibitor becomes more effective, so the composition is especially excellent in anticorrosiveness for wirings. When the pH is 10 or less, the composition is excellent in deposition removability, in particular, when the pH is 6 or less, the composition is especially excellent in removability of deposition originated from aluminum wirings by the dissolution agent, while when the pH is 7 or more, the composition is particularly excellent in removability of deposition originated from interlayer films during via hole formation.

Therefore, the pH is preferably 1 to 10 from the viewpoint of attaining deposition removability and anticorrosiveness for wirings at the same time. In addition, the pH is more preferably 1 to 6, even more preferably 1 to 5, even more preferably 1 to 4, and even more preferably 1 to 3, from the viewpoint of excellent removability of titanium-based deposition produced during via hole formation.

Also, the pH is preferably 6 to 10, more preferably 7 to 9.5, and especially preferably 7.5 to 9.0, from the viewpoint of attaining removability of deposition originated from interlayer films during via hole formation and anticorrosiveness for wirings at the same time, and the viewpoint of excellent removability of deposition originated from film components such as TEOS and deposition originated from resist.

In addition, when the above remover composition contains 50% by weight or more of water, the pH is preferably 1 to 10, and more preferably 1 to 5, from the viewpoint of deposition removability and anticorrosiveness for wirings.

Further, the remover composition may contain other additives, if necessary, to an extent that the functions of the above-mentioned deposition removability and anticorrosiveness for wirings are not drastically deteriorated. For example, the remover composition can contain a water-soluble solvent in order to impart permeability and the like, and the content of the water-soluble solvent is preferably 30% by weight or less, more preferably 20% by weight or less, and even more preferably 10% by weight or less. In addition, an anticorrosive agent, a surfactant, an antiseptic and the like can be added.

The remover composition used in Embodiment 1 may be used in any one of the steps of producing a semiconductor device or a semiconductor substrate. Specifically, the composition can be used in a step of producing a semiconductor device, including steps, for example, after development of resist, after dry etching, after wet etching and after ashing. Particularly, removability of deposition on aluminum wirings and anticorrosiveness for aluminum wirings are excellent. In particular, from the viewpoint of removability of deposition, it is preferable that the remover composition is used in the removing step after dry ashing, and the deposition removability and anticorrosiveness for aluminum wirings are excellent particularly in a semiconductor substrate or a semiconductor device with aluminum wirings.

The concentration of each component in the above-mentioned remover composition is a concentration which is preferable in its actual use. A high concentration product of the remover composition can be prepared and diluted prior to use. As the high concentration product, preferable is a product comprising 20 to 40% by weight of a sulfate, 1 to 5% by weight of 1-hydroxyethylidene-1,1-diphosphonic acid and 60 to 80% by weight of water.

Also, the remover composition prepared in a two-component form may be used by combining the two components to form single component at the time of use.

The remover composition used in Embodiment 1 may be prepared by mixing the above-mentioned dissolution agent, inhibitor and the like in a medium by known methods.

Since the remover composition used in Embodiment 1 has both excellent deposition removability and anticorrosiveness for wirings, the composition can be used in removal cleaning for a semiconductor substrate or a semiconductor device with wirings having a wiring width as narrow as 180 nm or less, to which conventional removers cannot be applied. In semiconductor substrates with wirings having a wiring width of 500 nm or more, even if wiring metal corrosion during deposition elimination is not minor, this is not likely to be problematic because the electric resistance will not be increased easily due to the wide wiring width. However, for narrow wirings having a wiring width of 180 nm or less, in accordance with higher-speed and more highly integrated devices, a large amount of corrosion results in a significant increase in electric resistance, which may cause a conductive defect. In such a situation, the remover composition used in Embodiment 1 can be advantageously applied particularly to a semiconductor substrate with wirings having a narrow wiring width, since the composition has high deposition removability and causes highly reduced amount of wiring metal corrosion due to the effect of the inhibitor.

2. Removal Cleaning Method for Semiconductor Substrate or Semiconductor Device

The removal cleaning method for a semiconductor substrate or a semiconductor device of Embodiment 1 has a feature that a semiconductor substrate or a semiconductor device with metal wirings is subjected to removal cleaning by using the remover composition described above. The means for removal cleaning are not particularly limited, and include immersing removal cleaning, oscillation removal cleaning, single wafer removal cleaning, removal cleaning utilizing a rotating means such as a spinner, paddle cleaning, removal cleaning by spraying in air or a liquid, ultrasonic removal cleaning and the like. Among them, immersing removal cleaning and oscillation removal cleaning are suitable.

The cleaning temperature is preferably 20° to 70° C., more preferably in the range of 20° to 60° C., and even more preferably 20° to 50° C., from the viewpoint of deposition dissolution, deposition removability, anticorrosiveness for metal wiring materials, safety and operability. Incidentally, there is no particular limitation to the other cleaning conditions in the above-mentioned means for removal cleaning.

In the rinsing step after cleaning with the above-mentioned remover composition, water rinsing can be employed. Conventional removers based on ammonium fluoride or based on an amine such as hydroxylamine are a solvent-based remover, so that they are difficult to be rinsed off with water. In addition, there is a possibility of corrosion of wirings and the like occurring when these removers are mixed with water. For that reason, there has been generally employed a method of rinsing with a solvent such as isopropanol. However, the remover composition used in Embodiment 1 is highly anticorrosive for wirings even under excessive water since the composition is water-based and the composition contains the inhibitor thereby to suppress corrosion of wirings. Therefore, water rinsing can be employed, which provides an economical removal cleaning method, with highly reduced environmental damage.

3. Method of Producing Semiconductor Substrate or Semiconductor Device

The method of producing a semiconductor substrate or a semiconductor device of Embodiment 1 has a feature that the method includes a step of removal cleaning for a semiconductor substrate or a semiconductor device by using the remover composition described above. The removal cleaning method for a semiconductor substrate or a semiconductor device, used in this producing method, is preferably the same method as described above. The semiconductor substrate or semiconductor device, obtained by using the above remover composition and the above method of cleaning a semiconductor substrate or a semiconductor device, has no remaining deposition, with highly reduced corrosion of metal wiring materials. Also, the composition and method can be used for removal cleaning for a fine semiconductor substrate or a semiconductor device with wirings having a wiring width of 180 nm or less, to which conventional removers cannot be applied. Therefore, the remover composition and method can be suitably used for producing smaller and higher performance electronic parts such as LCDs, memories and CPUs.

Incidentally, the invention of Embodiment 1 is suitable for producing a semiconductor substrate or a semiconductor device having wirings containing a metal such as aluminum, copper, tungsten or titanium, and excellent in removability of aluminum- and titanium-based deposition, so that it is particularly suitable for producing a semiconductor substrate or a semiconductor device in which a wiring material comprising aluminum and/or titanium is used.

Incidentally, the wiring width of these metal wirings is preferably 180 nm or less, and metal wirings having a wiring width of 130 nm or less, and preferably 90 nm or less, can be effectively cleaned.

Embodiment 2

Also, the present inventors have investigated the route of contamination of a semiconductor substrate or a semiconductor device (hereinafter simply referred to as a semiconductor). As a result, it has been found that when a remover composition is used in an open system for a long period of time or used in a circulation system, water in the composition evaporates during the removal cleaning, causing the dissolved solid matter to be precipitated on the side wall of the cleaning tank, the filter, and the like, and further spread in the atmosphere by air blowing or the like on the clean room, which contaminates the objects to be cleaned, including a semiconductor substrate and the like. Therefore, the inventors have focused their attention on solubility in water of the components of the remover composition used in the removal cleaning step, and thus completed the invention of Embodiment 2.

Specifically, the remover composition for semiconductor of Embodiment 2 is a remover composition, containing a) water, and b) a compound having a solubility (25° C.) in water of 10 g or more/100 g of water, wherein the content of the water a) is 50 to 99.8% by weight of the remover composition, and the content of the compound b) is 90% by weight or more of the portion of the remover composition excluding the water a), and the remover composition has an aluminum oxide dissolution amount as measured according to the standard test (A-2) of 10 ppm or more, and an aluminum etching amount as measured according to the standard test (B-2) of 7 nm or less. By using such a remover composition, generation of precipitates from the remover composition, which occurs when water of the medium evaporates, for instance, is suppressed in the cleaning step. Therefore, there is exhibited an effect that contamination of semiconductor can be prevented. Further there is exhibited an effect that high-performance electronic parts such as LCDs, memories and CPUs can be produced.

Particularly, the remover composition is highly effective for a semiconductor substrate or a semiconductor device with aluminum wirings having a narrow wiring width, of which performance is significantly affected by only a small amount of contamination.

In addition, there is a problem that the generation of these precipitates results in clogging of filters in pipes and the like, and also affects operability and the like. The remover composition of the present invention also has an effect of preventing the clogging.

The remover composition of Embodiment 2 contains a) water in an amount of 50 to 99.8% by weight. The content of water in the remover composition is more preferably 60 to 98% by weight, and even more preferably 70 to 96% by weight, from the viewpoint of more effective suppression of generation of precipitates and stability of the composition, operability, environmental issues such as waste water treatment and the viewpoint of removability.

In the remover composition of Embodiment 2, the content of the compound b) having a solubility (25° C.) in water of 10 g or more/100 g of water is 90% by weight or more of the portion of the remover composition excluding the water a). The content is preferably 93% by weight or more, and more preferably 95% by weight or more, of the portion of the remover composition excluding the water a) in order to suppress more effectively generation of precipitates upon water vaporization.

Further, the present inventors have found that a remover composition with an alumina dissolution ability of a certain level or higher and an aluminum etching amount of a certain level or lower is highly effective for enhancing deposition removability after ashing of aluminum wirings while suppressing corrosion of aluminum wirings. Specifically, the remover composition of Embodiment 2 has another feature that the alumina dissolution amount as measured according to the standard test (A-2) is 10 ppm or more, and the aluminum etching amount as measured according to the standard test (B-2) is 7 nm or less. By using such a remover composition, there are exhibited effects that excellent removability of deposition produced during formation of semiconductor device is obtained and that corrosion of materials such as wiring metals can be prevented.

The procedures of the standard test (A-2) and the standard test (B-2) will be described below.

<Standard Test (A-2)>

1) Twenty grams of a remover composition is placed in a 100-ml polyethylene container, and kept at a constant temperature in a thermostatic chamber at 40° C.
2) Next, 0.1 g of an alumina powder (trade name: "WA-10000," manufactured by Fujimi Corporation; average particle size: 0.5 μm) is added to the solution, and sufficiently stirred for 30 minutes.
3) Ten grams of an aliquot of the supernatant is placed in a centrifuging tube, and allowed to separate using a centrifuge (trade name: "himac CP56G," manufactured by Hitachi, Ltd.) under conditions at 20,000 r/min for 15 minutes. The light emission intensity from aluminum is determined for the resulting supernatant using an ICP emission analyzer (trade name: "JY238," manufactured by Horiba Ltd.).
4) The alumina dissolution amount is determined from a calibration curve made using an aqueous solution of aluminum of known concentrations.

Incidentally, from the viewpoint of performing the measurement more excellently, the supernatant is diluted ten-fold with ultrapure water for measuring the light emission intensity from aluminum in 3). When the concentration is over the range of the calibration curve (0 to 2 ppm), the diluted solution is again diluted ten-fold for the measurement. Also in 4), an aqueous solution of aluminum (1,000 ppm) is diluted 10,000-fold (0.1 ppm) and 500-fold (2.0 ppm), respectively, with ultrapure water, and the resulting dilutions are subjected to an atomic absorption analysis to make a calibration curve (three-point calibration).

<Standard Test (B-2)>

1) A test piece is prepared by cutting out a 3-cm square piece from a substrate (thickness: 1 mm) having an aluminum sputtering layer (thickness: about 500 nm) formed on a silicon wafer by a CVD method.
2) The test piece is subjected to pre-cleaning by immersing in a 0.1 wt % aqueous HF solution at room temperature for 30 seconds, rinsing with water, and drying by blowing nitrogen. The fluorescent X-ray intensity from aluminum is measured for the resulting test piece, using a fluorescent X-ray measuring device ("ZSX100e," manufactured by Rigaku Denki Kogyo Co., Ltd.) (measurement of film thickness before immersing in the test aqueous solution).
3) Twenty grams of a remover composition is placed in a 100-ml polyethylene container, and kept at a constant temperature in a thermostatic chamber at 40° C.
4) Thereafter, one test piece is immersed in 20 g of the remover composition kept at a constant temperature at 40° C. for 30 minutes, rinsed with ion exchange water and dried by blowing nitrogen. Then, the fluorescent X-ray intensity from aluminum is measured for the resulting test piece on the same position as that measured before immersing, using a fluorescent X-ray measuring device (measurement of film thickness after immersing in the test aqueous solution).
5) The film thicknesses before and after immersing in the test aqueous solution are calculated from the calibration curve made previously for aluminum sputtering film of known film thicknesses using a fluorescent X-ray measuring device.

The remover composition of Embodiment 2 is one having an alumina dissolution amount as measured according to the above-mentioned standard test (A-2) of 10 ppm or more. From the viewpoint of enhancing deposition removability after ashing, the alumina dissolution amount is preferably 12 ppm or more, and more preferably 15 ppm or more. Also, the aluminum etching amount as measured according to the standard test (B-2) is 7 nm or less and, from the viewpoint of more effectively preventing corrosion of aluminum wirings, preferably 5 nm or less, and more preferably 3 nm or less.

It is desirable that the above remover composition contains an acid as well as an inorganic acid salt and/or an organic acid salt, as the compound b) having a solubility (25° C.) in water of 10 g or more/100 g of water. Here, the acid acts as a dissolution agent for eliminating deposition on aluminum wirings (aluminum oxide dissolution agent), and the inorganic acid salt and/or the organic acid salt acts as an etching inhibitor for preventing corrosion of aluminum wirings (aluminum corrosion inhibitor), thereby to perform efficiently removal cleaning of deposition on aluminum wirings and titanium-based deposition on the bottom of via holes and to suppress corrosion of materials such as aluminum wirings. Also, when the solubilities in water of the acid, inorganic acid salt and organic acid salt are higher than the above value, in the case where the remover composition is exposed to high temperature or continuously used in a circulation system for a long period of time, cleaning can be performed without generation of precipitates or contamination of a semiconductor substrate and a semiconductor device.

The acid in Embodiment 2 is not particularly limited, as long as it can satisfy the above requirement. The acid includes, for example, inorganic acids such as phosphonic acid, sulfuric acid, nitric acid, phosphoric acid and hydrochloric acid, and organic acids such as organic phosphonic acid, organic sulfuric acid, carboxylic acid and organic sulfonic acid. Among them, from the viewpoint of attaining deposition removability and anticorrosiveness for wirings at the same time, preferable are sulfuric acid (solubility of 50 g or more/100 g of water), hydrochloric acid (solubility of 50 g or more/100 g of water), nitric acid (solubility of 50 g or more/100 g of water), methanesulfonic acid (solubility of 50 g or more/100 g of water), sulfosuccinic acid (solubility of 50 g or more/100 g of water), oxalic acid (solubility of 11.6 g/100 g of water) and 1-hydroxyethylidene-1,1-diphosphonic acid (solubility of 50 g or more/100 g of water). In particular, sulfuric acid, oxalic acid and 1-hydroxyethylidene-1,1-diphosphonic acid are preferable. Here, the "solubility (g/100 g of water)" means the amount of a substance dissolved in 100 g of water (25° C.).

The solubility (25° C.) of the acid in 100 g of water needs to be 10 g or more, from the viewpoint of more effectively suppressing generation of precipitates and preventing contamination. The solubility is preferably 15 g or more, and even more preferably 20 g or more.

In addition, the content of the acid in the remover composition is preferably 0.01 to 5% by weight, more preferably 0.03 to 3% by weight, even more preferably 0.05 to 2% by weight, from the viewpoint of suppressing generation of precipitates and attaining deposition removability and anticorrosiveness for wirings at the same time.

Also, the inorganic acid salt and/or the organic acid salt used in Embodiment 2 is not particularly limited, as long as it can satisfy the above requirement. In particular among them, one or more salts selected from the group consisting of carboxylates, sulfates, sulfonates, phosphonates, nitrates, hydrochlorides and borates are desirable. Specifically included are ammonium acetate (solubility of 50 g or more/100 g of water), ammonium citrate (solubility of 50 g or more/100 g of water), ammonium sulfosuccinate (solubility of 50 g or more/

100 g of water), ammonium sulfate (solubility of 43.3 g/100 g of water), ammonium methanesulfonate (solubility of 50 g or more/100 g of water), ammonium phosphonate (solubility of 50 g or more/100 g of water), ammonium nitrate (solubility of 50 g or more/100 g of water), ammonium chloride (solubility of 28.2 g/100 g of water), and the like. With regard to the cations, these salts may be amine salts or quaternary ammonium salts, as well as ammonium salts. The amines are not particularly limited, as long as they are basic, and include hydroxylamines such as hydroxylamine and diethylhydroxylamine; alkylamines such as ethylamine, propanediamine, dibutylamine and trimethylamine; alkanolamines such as monoethanolamine, methylethanolamine and methyldiethanolamine; aromatic amines such as aniline and benzylamine; and the like. The quaternary ammonium ions which form a quaternary ammonium salt include tetramethylammonium ion, tetraethylammonium ion, triethylmethylammonium ion, and the like.

Among these combinations, in particular, ammonium sulfate, methyldiethanolamine sulfate and ammonium chloride are preferable, and ammonium sulfate is most preferable.

Also, the combination of the acid and the salt is properly selected from the above-mentioned acids and salts without any particular limitation. Preferred examples include a combination of 1-hydroxyethylidene-1,1-diphosphonic acid and a sulfate, a combination of sulfuric acid and a nitrate, a combination of oxalic acid and a sulfate, and other combinations, from the viewpoint of the three properties of deposition removability, anticorrosiveness for wirings and prevention of contamination of objects to be cleaned being particularly excellent.

The preferred examples of the combination of the acid and the salt as mentioned above in Embodiment 1 may be also used as a preferred example in Embodiment 2.

The solubility (25° C.) of the inorganic acid salt and/or the organic acid salt in 100 g of water needs to be 10 g or more, from the viewpoint of suppressing generation of precipitates and preventing contamination. The solubility is preferably 20 g or more, and even more preferably 30 g or more.

Also, the content of the inorganic acid and/or the organic acid salt in the remover composition is preferably 0.2 to 40% by weight, more preferably 0.5 to 30% by weight, and even more preferably 1 to 20% by weight, in order to suppress generation of precipitates, and from the viewpoint of anticorrosiveness for metal materials such as aluminum wirings, homogenous dissolution in water, and deposition dissolution.

The formulated weight ratio of the acid to the inorganic acid salt and/or the organic acid salt (hereinafter also simply referred to as salt) (acid/salt) in the remover composition of Embodiment 2 is preferably 2/1 to 1/30, more preferably 1/2 to 1/30, even more preferably 1/4 to 1/30, and even more preferably 1/6 to 1/25, from the viewpoint of attaining deposition removability and anticorrosiveness for wirings at the same time.

With respect to the pH of the remover composition of Embodiment 2, when the pH is 1 or more, the salt becomes more effective, so the composition is especially excellent in anticorrosiveness for wirings. When the pH is 10 or less, the composition is excellent in deposition removability, in particular, when the pH is 5 or less, the composition is especially excellent in removability by the acid of deposition originated from aluminum wirings, while when the pH is 7 or more the composition is particularly excellent in removability of deposition originated from interlayer films during via hole formation.

Therefore, the pH is preferably 1 to 10 from the viewpoint of attaining deposition removability and anticorrosiveness for wirings at the same time. In addition, the pH is more preferably 1 to 6, even more preferably 1 to 5, even more preferably 1 to 4, and even more preferably 1 to 3, from the viewpoint of excellent removability of titanium-based deposition produced during via hole formation.

Also, the pH is preferably 6 to 10, more preferably 7 to 9.5, and especially preferably 7.5 to 9.0, from the viewpoint of attaining removability of deposition originated from interlayer films during via hole formation and anticorrosiveness for wirings at the same time, and the viewpoint of excellent removability of deposition originated from film components such as TEOS and deposition originated from resist.

The remover composition of Embodiment 2 can also contain a water-soluble solvent as the component b) to impart permeability and the like, in addition to the above-mentioned acid and salt. As the amount of the solvent is increased, the amount of dissolution of the acid and salt contained is decreased, and thus precipitates are easily generated. Therefore, the content of the water-soluble solvent in the remover composition of Embodiment 2 is preferably 30% by weight or less, more preferably 20% by weight or less, and even more preferably 10% by weight or less.

In addition, the remover composition may further contain other additives, if necessary, to an extent that no precipitates are generated when water evaporates, and the functions of deposition removability and anticorrosiveness for wirings are not drastically deteriorated. For instance, it is preferable that a fluorine-containing compound is not contained, if possible, from the viewpoint of anticorrosiveness for wirings and an issue of waste water treatment. However, the compound can be added to an extent that the above functions are not impaired, and the content thereof in the composition is preferably 0.1% by weight or less, more preferably 0.05% by weight or less, even more preferably 0.01% by weight or less, and even more preferably 0.001% by weight or less. Especially preferably, no fluorine-containing compound is contained. Besides, an anticorrosive agent, a surfactant, an antiseptic and the like can be added in accordance with the intended purpose.

The remover composition of Embodiment 2 may be used in any one of the steps of producing a semiconductor device or a semiconductor substrate. Specifically, the composition can be used in a step of producing a semiconductor device, including steps, for example, after development of resist, after dry etching, after wet etching and after ashing. Particularly, removability of deposition on aluminum wirings and anticorrosiveness for aluminum wirings are excellent. In particular, from the viewpoint of removability of deposition, it is preferable that the remover composition is used in the removing step after dry ashing, and the deposition removability and anticorrosiveness for aluminum wirings are excellent particularly in a semiconductor substrate or a semiconductor device with aluminum wirings.

The concentration of each component in the above-mentioned remover composition is a concentration which is preferable in its actual use. A high concentration product of the remover composition can be prepared and diluted prior to use. As the high concentration product, preferable is a product comprising 0.01 to 5% by weight of the acid and 0.2 to 40% by weight of the inorganic acid salt and/or the organic acid salt. Also, the remover composition prepared in a two-component form may be used by combining the two components to form single component at the time of use.

The remover composition of Embodiment 2 may be prepared by mixing the water a), the compound b) having a solubility (25° C.) in water of 10 g or more/100 g of water and, if necessary other additives by known methods.

The cleaning method for a semiconductor (specifically semiconductor substrate or semiconductor device) in Embodiment 2 has a feature that a semiconductor substrate or a semiconductor device is subjected to removal cleaning by using the above remover composition. The means for removal cleaning include immersing removal cleaning, oscillation removal cleaning, single wafer removal cleaning, removal cleaning utilizing a rotating means such as a spinner, paddle cleaning, removal cleaning by spraying in air or a liquid, ultrasonic removal cleaning and the like. Among them, immersing removal cleaning and oscillation removal cleaning are suitable.

The cleaning temperature is preferably in the range of 20° to 60° C., and even more preferably 20° to 40° C., for suppressing generation of precipitates, and from the viewpoint of deposition dissolution, deposition removability, anticorrosiveness for metal wiring materials, safety and operability.

In the rinsing step after cleaning with the remover composition of Embodiment 2, water rinsing can be employed. Conventional removers based on ammonium fluoride or based on an amine such as hydroxylamine are a solvent-based remover, so that they are difficult to be rinsed off with water. In addition, there is a possibility of corrosion of wirings and the like occurring when these removers are mixed with water. For that reason, there has been generally employed a method of rinsing with a solvent such as isopropanol. However, the remover composition of Embodiment 2 is highly anticorrosive for wirings even under excessive water since the composition is water-based and the composition contains the salt mentioned above thereby to suppress corrosion of wirings. Therefore, water rinsing can be employed, which provides an economical cleaning method for semiconductor, with highly reduced environmental damage.

The method of producing a semiconductor of Embodiment 2 is a method including the step of cleaning using the above-mentioned cleaning method. Specifically, the method of Embodiment 2 has a feature that the method includes a step of removal cleaning for a semiconductor substrate or a semiconductor device by using the remover composition. Incidentally, specific operations for the removal cleaning are not particularly limited, as long as they are the same as those described above. The semiconductor substrate or semiconductor device, obtained by using the above remover composition and the above method of cleaning a semiconductor substrate or a semiconductor device, has no remaining deposition, with highly reduced corrosion of metal wiring materials. Also, the composition and method can be used for removal cleaning for a semiconductor substrate or a semiconductor device with wirings having a narrow wiring width of 180 nm or less, to which conventional removers cannot be applied due to wiring corrosion. Therefore, the remover composition and method can be suitably used for producing smaller and higher performance electronic parts such as LCDs, memories and CPUs.

Incidentally, the invention of Embodiment 2 is suitable for a semiconductor substrate or a semiconductor device having wirings containing a metal such as aluminum, copper, tungsten or titanium, and excellent in removability of aluminum- and titanium-based deposition, so that it is particularly suitable for a semiconductor substrate or a semiconductor device in which a wiring material comprising aluminum and/or titanium is used.

Embodiment 3

Also, the present inventors have found that when pH change in removal cleaning liquid is minimized during the cleaning of a semiconductor such as a semiconductor substrate or a semiconductor device, a condition can be kept in which deposition eliminability is high and anticorrosiveness for wirings is high, allowing for continuous cleaning, and thus completed the invention of Embodiment 3. In particular, for a semiconductor substrate or a semiconductor device with aluminum wirings having a narrow wiring width, since only a small amount of wiring corrosion can significantly affect the performance, stable cleaning performance is important.

Specifically, the remover composition of Embodiment 3 is a water-based remover composition, containing an aluminum oxide dissolution agent and an aluminum corrosion inhibitor, wherein the water-based remover composition has: 1) a water content of 50% by weight or more; 2) an aluminum oxide dissolution amount as measured according to the standard test (A-2) of 10 ppm or more; 3) an aluminum etching amount as measured according to the standard test (B-2) of 7 nm or less; and provides 4) a pH change before and after the standard test (A) of 0.5 or less. By cleaning semiconductors using the remover composition, there is exhibited an effect that excellent removability of deposition produced during the formation of a semiconductor device and excellent anticorrosiveness for materials such as wiring metals are obtained over a long period of time.

Here, the standard test (A-2) and the standard test (B-2) are the same as those descried above.

It is desirable that the remover composition of Embodiment 3 is one having an aluminum oxide dissolution amount as measured according to the above-mentioned standard test (A-2) of 10 ppm or more and, from the viewpoint of enhancing deposition removability after ashing, preferably 12 ppm or more, and more preferably 15 ppm or more. Also, It is desirable that the aluminum etching amount as measured according to the standard test (B-2) is 7 nm or less and, from the viewpoint of preventing corrosion of aluminum wirings, preferably 5 nm or less, and more preferably 3 nm or less.

Further, it has been found that it is necessary to minimize pH changes during cleaning in order for the remover composition of Embodiment 3 to retain the cleaning ability for a long period of time (or to have an applicability for continuous cleaning). As a measure for this, a pH change before and after the standard test (A-2) can be used, and it is important that the amount of change is 0.5 or less. A method of measuring the pH change before and after the standard test (A-2) includes measuring the pH of the remover composition at 25° C. in advance, carrying out the standard test (A-2), thereafter setting again the remover composition at 25° C. and measuring the pH of the composition, and calculating the pH difference before and after the test as the pH change. When the pH change is 0.5 or less, a change in deposition removability and a change in performance of anticorrosiveness for aluminum wirings in the remover composition are minimized, which allows for continuous cleaning. The pH change is preferably 0.4 or less, and more preferably 0.3 or less, from the viewpoint of enhancing applicability for long-term continuous cleaning.

The remover composition of Embodiment 3 contains an aluminum oxide dissolution agent and an aluminum corrosion inhibitor.

The aluminum oxide dissolution agent refers to an agent which dissolves aluminum oxide, and is preferably an acid due to its excellent dissolubility. The acid includes, for example, inorganic acids such as phosphonic acid, sulfuric acid, nitric acid, phosphoric acid and hydrochloric acid, and organic acids such as organic phosphonic acid, organic sulfuric acid, carboxylic acid and organic sulfonic acid. Among them, from the viewpoint of attaining deposition removability and anticorrosiveness for wirings at the same time, sulfuric acid, hydrochloric acid, nitric acid, methanesulfonic acid, sulfosuccinic acid, oxalic acid and 1-hydroxyethylidene-1,1-diphosphonic acid are preferable and, in particular, sulfuric acid, oxalic acid and 1-hydroxyethylidene-1,1-diphosphonic acid are preferable.

The content of the aluminum oxide dissolution agent is preferably 0.01 to 5% by weight, more preferably 0.01 to 3% by weight, even more preferably 0.01 to 2% by weight, and especially preferably 0.05 to 2% by weight, from the viewpoint of well-balanced deposition removability and anticorrosiveness for wirings, and from the viewpoint of reducing pH change during cleaning.

The aluminum corrosion inhibitor refers to an agent which has an effect of preventing corrosion of aluminum, and is preferably an inorganic acid salt and/or an organic acid salt due to its excellent corrosion preventive effect. Further, the inorganic acid salt and the organic acid salt have an action to suppress pH change when metal oxides and the like as deposition are dissolved, and are presumed to serve as a buffer. As the inorganic acid salt and the organic acid salt, one or more salts selected from the group consisting of carboxylates, sulfates, sulfonates, phosphonates, nitrates, hydrochlorides and borates are desirable. Specifically included are ammonium acetate, ammonium citrate, ammonium oxalate, ammonium sulfosuccinate, ammonium sulfate, ammonium methanesulfonate, ammonium phosphonate, ammonium nitrate, ammonium chloride, ammonium tetraborate, and the like. With regard to the cations, these salts may be amine salts or quaternary ammonium salts, as well as ammonium salts. The amines are not particularly limited, as long as they are basic, and include hydroxylamines such as hydroxylamine and diethylhydroxylamine; alkylamines such as ethylamine, propanediamine, dibutylamine and trimethylamine; alkanolamines such as monoethanolamine, methylethanolamine and methyldiethanolamine; aromatic amines such as aniline and benzylamine; and the like. The quaternary ammonium ions which form a quaternary ammonium salt include tetramethylammonium ion, tetraethylammonium ion, triethylmethylammonium ion, lauryltrimethylammonium ion, benzyltrimethylammonium ion, and the like. Among these combinations, ammonium sulfate, tetramethylammonium sulfate, methylethanolamine sulfate, methyldiethanolamine sulfate and ammonium chloride are especially preferable, and ammonium sulfate is most preferable.

The content of the aluminum corrosion inhibitor in the remover composition of Embodiment 3 is preferably 0.2 to 40% by weight, more preferably 0.5 to 30% by weight, even more preferably 1 to 20% by weight, and especially preferably 5 to 10% by weight, from the viewpoint of suppressing pH change during cleaning in order to maintain anticorrosiveness for metal materials such as aluminum wirings and deposition dissolubility.

The formulated weight ratio of the aluminum oxide dissolution agent to the aluminum corrosion inhibitor (aluminum oxide dissolution agent/aluminum corrosion inhibitor) in Embodiment 3 is preferably 2/1 to 1/30, more preferably 1/2 to 1/30, even more preferably 1/4 to 1/30, and even more preferably 1/6 to 1/25, from the viewpoint of performing continuous cleaning with maintaining deposition removability and anticorrosiveness for wirings.

In addition, the combination of the aluminum oxide dissolution agent and the aluminum corrosion inhibitor is properly selected from the aluminum oxide dissolution agents and the aluminum corrosion inhibitors mentioned above, without any particular limitation. Preferred examples include a combination of 1-hydroxyethylidene-1,1-diphosphonic acid and a sulfate, a combination of sulfuric acid and a nitrate, a combination of oxalic acid and a phosphonate, and other combinations, from the viewpoint of the three properties of deposition removability, anticorrosiveness for wirings and small pH change being particularly excellent.

The preferred examples of the combination of the dissolution agent and the inhibitor as mentioned above in Embodiment 1 may be also used as a preferred example in Embodiment 3.

With respect to the pH of the remover composition of Embodiment 3, when the pH is 1 or more, the aluminum corrosion inhibitor becomes more effective, so the composition is especially excellent in anticorrosiveness for wirings. When the pH is 10 or less, the composition is excellent in deposition removability, in particular, when the pH is 6 or less, the composition is especially excellent in removability of deposition originated from aluminum wirings by the aluminum oxide dissolution agent, while when the pH is 7 or more the composition is particularly excellent in removability of deposition originated from interlayer films during hole formation.

Therefore, the pH is preferably 1 to 10 from the viewpoint of attaining deposition removability and anticorrosiveness for wirings at the same time. In addition, the pH is more preferably 1 to 6, even more preferably 1 to 5, even more preferably 1 to 4, and even more preferably 1 to 3, from the viewpoint of excellent removability of titanium-based deposition produced during via hole formation.

Also, the pH is preferably 6 to 10, more preferably 7 to 9.5, and especially preferably 7.5 to 9.0, from the viewpoint of attaining removability of deposition originated from interlayer films during hole formation and anticorrosiveness for wirings at the same time, and the viewpoint of excellent removability of deposition originated from film components such as TEOS and deposition originated from resist.

Further, the remover composition may contain other additives, if necessary, to the extent that the deposition removability and anticorrosiveness for wirings are retained and the change in pH is not large. For example, a water-soluble solvent may be added in order to impart permeability and the like, and the content thereof is preferably 30% by weight or less, more preferably 20% by weight or less, and even more preferably 10% by weight or less. The water-soluble solvent includes glycol compounds such as butyl diglycol. In addition, it is preferable that a fluorine-containing compound is not contained, if possible, from the viewpoint of anticorrosiveness for wirings and an issue of waste water treatment. However, the compound can be added to an extent that the above functions are not impaired, and the content thereof in the composition is preferably 0.1% by weight or less, more preferably 0.05% by weight or less, even more preferably 0.01% by weight or less, and even more preferably 0.001% by weight or less. Especially preferably, no fluorine-containing compound is contained. Besides, an anticorrosive agent, a surfactant, an antiseptic and the like can be added in accordance with the intended purpose.

The remover composition of Embodiment 3 can be prepared by mixing the above-mentioned aluminum oxide dissolution agent, the aluminum corrosion inhibitor and the like in a medium by known methods. Also, the remover composition prepared in a two-component form may be used by combining the two components to form single component at the time of use.

Since the method of continuous cleaning of Embodiment 3 has a step of cleaning at 60° C. or lower by using the above-mentioned remover composition and allows excellent deposition removability and anticorrosiveness for wirings to be retained even in a long-term cleaning, the method can be used in removal cleaning for a semiconductor substrate or a semiconductor device with wirings having a wiring width as narrow as 180 nm or less, to which conventional methods cannot be applied. In semiconductor substrates with wirings having a wiring width of 500 nm or more, even if wiring metal corrosion during deposition elimination is not minor, this is not likely to be problematic because the electric resistance will not be increased easily due to the wide wiring width. However, for narrow wirings having a wiring width of 180 nm or less, in accordance with higher-speed and more highly integrated devices, a large amount of corrosion results in a significant increase in electric resistance, which may cause a conductive defect. In such a situation, the method of continuous cleaning of Embodiment 3 can be advantageously applied to a semiconductor substrate or a semiconductor device with wirings having a narrow wiring width, particularly to a semiconductor substrate or a semiconductor device with aluminum wirings having a wiring width as narrow as 180 nm or less, since a condition can be continuously kept in which deposition removability is high and amount of wiring metal corrosion is highly reduced.

In the method of continuous cleaning of Embodiment 3, the means for removal cleaning for a semiconductor substrate or a semiconductor device are not particularly limited, and include immersing removal cleaning, oscillation removal cleaning, single wafer removal cleaning, removal cleaning utilizing a rotating means such as a spinner, paddle cleaning, removal cleaning by spraying in air or a liquid, ultrasonic removal cleaning and the like. Among them, immersing removal cleaning and oscillation removal cleaning are suitable.

The cleaning temperature is 60° C. or lower, preferably 50° C. or lower, from the viewpoint of deposition dissolution, deposition removability, anticorrosiveness for metal wiring materials, safety and operability. Incidentally, there is no particular limitation to the other cleaning conditions in the above-mentioned means for removal cleaning.

In the rinsing step after cleaning with the remover composition, water rinsing can be employed. Conventional removers based on ammonium fluoride or based on an amine such as hydroxylamine are a solvent-based remover, so that they are difficult to be rinsed off with water. In addition, there is a possibility of corrosion of wirings and the like occurring when these removers are mixed with water. For that reason, there has been generally employed a method of rinsing with a solvent such as isopropanol. However, the remover composition of Embodiment 3 is highly anticorrosive for wirings even under excessive water since the composition is water-based and the composition contains the inhibitor thereby to suppress corrosion of wirings. Therefore, water rinsing can be employed, which provides an economical removal cleaning method, with highly reduced environmental damage.

The method of producing a semiconductor (for example, semiconductor substrate or semiconductor device) of Embodiment 3 is a method including the step of cleaning using the above-mentioned method of continuous cleaning. Specifically, the method of Embodiment 3 has a feature that the method includes a step of cleaning a semiconductor substrate or a semiconductor device by using the above-mentioned method of continuous cleaning. The semiconductor substrate or semiconductor device, obtained by using the method of continuous cleaning, has highly reduced amount of remaining deposition and corrosion of metal wiring materials. Also, the method can be used for removal cleaning for a semiconductor substrate or a semiconductor device with wirings having a narrow wiring width of 180 nm or less, to which conventional cleaning methods cannot be applied. Therefore, the method can be suitably used for producing smaller and higher performance electronic parts such as LCDs, memories and CPUs.

Incidentally, the invention of Embodiment 3 is suitable for production of a semiconductor substrate or a semiconductor device having wirings containing a metal such as aluminum, copper, tungsten or titanium, and excellent in removability of aluminum- and titanium-based deposition, so that it is particularly suitable for production of a semiconductor substrate or a semiconductor device in which a wiring material comprising aluminum and/or titanium is used.

EXAMPLES

Now the present invention will be described and explained in more detail by way of Examples. These Examples merely disclose the present invention and are not intended to limit the present invention.

Examples I-1 to I-15 and Comparative Examples I-1 to I-11

I-1. Alumina Dissolution Test and Aluminum Etching Test

Table 1 shows the results of alumina dissolution amounts for the dissolution agents, as measured according to the standard test (A-1), and Table 2 shows the results of aluminum etching amounts for the inhibitors, as measured according to the standard test (B-1).

TABLE 1

| Dissolution Agent | Alumina Dissolution Amount (ppm) |
|---|---|
| Phosphoric Aid | 26 |
| Phosphonic Acid | 31 |
| Hydrochloric Acid | 16 |
| Nitric Acid | 15 |
| Sulfuric Acid | 22 |
| Boric Acid | 1 |
| Sulfosuccinic Acid | 13 |
| Methanesulfonic Acid | 17 |
| Oxalic Acid | 26 |
| 1-Hydroxyethylidene-1,1-Diphosphonic Acid (HEDP) | 20 |
| Dodecylbenzenesulfonic Acid (LAS) | 5 |
| Propionic Acid | 5 |
| Phthalic Anhydride | No Dissolution |
| Isobutyric Acid | 6 |
| Acetic Acid | 7 |
| Ethylenediamine Tetraacetic Acid | No Dissolution |
| Sulfuric Acid + Oxalic Acid [1] | 33 |
| Isobutyric Acid + Acetic Acid [1] | 11 |

[1] The mixing ratio of the two components was 50/50 (weight ratio) and the total amount was adjusted so as to form a 0.2 wt % aqueous solution.

TABLE 2

| Inhibitor | Aluminum Etching Amount (nm) |
|---|---|
| Without Addition | 8.0 |
| Ammonium Phosphonate | 6.0 |
| Ammonium Nitrate | 6.1 |
| Ammonium Chloride | 1.8 |
| Ammonium Sulfate | 3.0 |
| Methyldiethanolamine Sulfate | 3.2 |
| Tetramethylammonium Sulfate | 3.5 |
| Ammonium Tetraborate | 5.9 |

TABLE 2-continued

| Inhibitor | Aluminum Etching Amount (nm) |
|---|---|
| Ammonium Phosphate | 44.6 |
| Ammonium Fluoride | >500 |
| Ammonium Acetate | 0 |
| Ammonium Citrate | 0 |
| Ammonium Oxalate | 2.7 |
| Ammonium Sulfosuccinate | 1.0 |
| Ammonium Methanesulfonate | 1.2 |
| Tetramethylammonium Formate | 0.6 |
| Tetramethylammonium Acetate | 1.5 |
| Sodium Polyoxyetylene Lauryl Ether Sulfate | 7.5 |

I-2. Wafer for Evaluation

Under the following conditions, patterned wafers with aluminum (Al) wirings respectively having a wiring width of 0.5 μm (500 nm) and 0.18 μm (180 nm), and a patterned wafer with holes having a diameter of 0.5 μm (500 nm) were cut into a 1-cm square piece, and the pieces were used for the cleaning test.
(Structure of Aluminum Wirings)
 TiN/Al—Si/TiN/Ti/SiO$_2$/Substrate I-3. Preparation of Remover Composition Remover compositions having compositions (each numerical value: % by weight), shown in Tables 3 and 4, were prepared using the dissolution agents and inhibitors shown in Tables 1 and 2.

I-4. Evaluation of Removability (1) Removing Method: A wafer for evaluation was immersed in 30 ml of a remover composition to perform removal at 40° C. for 15 minutes.
(2) Rinsing Method: The wafer for evaluation was immersed in 30 ml of ultrapure water at 25° C. for 1 minute, and this step was repeated twice to complete rinsing.
(3) Evaluation Method: The wafer for evaluation after rinsing was dried. Thereafter, the removability of deposition on aluminum wirings and the removability of deposition originated from interlayer films of the patterned wafer with holes, as well as the anticorrosiveness were evaluated based on the following four ratings, using an FE-SEM (scanning electron microscope) at a magnification of 50,000 to 100,000.

Here, only Comparative Example 9 was evaluated by changing the immersion conditions in the Removing Method to those at 25° C. for 5 minutes.
(Removability of Deposition on Al Wirings/Removability of Deposition Originated from Interlayer Film)
 ⊚: Remaining deposition is not confirmed at all.
 ○: A part of deposition remains.
 Δ: Substantial deposition remains.
 x: Deposition cannot be removed.
(Anticorrosiveness for Al Wirings)
 ⊚: Corrosion of Al wirings is not confirmed at all.
 ○: A part of insulating materials are corroded.
 Δ: Substantial insulating materials are corroded.
 x Insulating materials are corroded.

Here, acceptable products are one rated as "⊚" or "○" for both of the removability of deposition on aluminum wirings or removability of deposition originated from interlayer films, and the anticorrosiveness for aluminum wirings.

TABLE 3

| | Remover Composition | | | | | |
|---|---|---|---|---|---|---|
| Ex. Nos. | Dissolution Agent (% by weight) | Inhibitor (% by weight) | Water % by weight | Other Additives (% by weight) | pH | Dilution Ratio[1] |
| I-1 | Phosphonic Acid (0.2) | Ammonium Methanesulfonate (5.0) | 94.8 | | 3.5 | 1 |
| I-2 | Sulfuric Acid (1.0) | Ammonium Nitrate (25.0) | 74.0 | | 3.1 | 1 |
| I-3 | Sulfuric Acid (1.0) | Ammonium Nitrate (25.0) | 74.0 | | 3.1 | 5 |
| I-4 | Oxalic Acid (1.0) | Ammonium Phosphonate (30.0) | 69.0 | | 2.3 | 1 |
| I-5 | Oxalic Acid (1.0) | Ammonium Phosphonate (30.0) | 69.0 | | 2.3 | 5 |
| I-6 | Sulfosuccinic Acid (0.5) | Ammonium Chloride (4.0) | 92.5 | DMSO (3.0) | 3.2 | 1 |
| I-7 | HEDP (1.0) | Ammonium Sulfate (20.0) | 79.0 | | 2.1 | 1 |
| I-8 | HEDP (1.0) | Ammonium Sulfate (20.0) | 79.0 | | 2.8 | 5 |
| I-9 | HEDP (0.2) | Ammonium Sulfate (4.0) | 95.8 | | 2.2 | 1 |
| I-10 | HEDP (1.0) | Ammonium Sulfate (5.0) | 94.0 | | 2.2 | 1 |
| I-11 | HEDP (2.0) | Ammonium Sulfate (5.0) | 93.0 | | 1.9 | 1 |
| I-12 | HEDP (5.0) | Ammonium Sulfate (5.0) | 90.0 | | 1.6 | 1 |
| I-13 | Sulfuric Acid (0.1) Oxalic Acid (0.1) | Ammonium Sulfate (5.0) | 94.8 | | 2.3 | 1 |
| I-14 | HEDP (0.2) | Ammonium Sulfate (4.0) | 95.8 | | 8.0[2] | 1 |
| I-15 | HEDP (0.2) | Ammonium Sulfate (4.0) | 95.8 | | 9.0[3] | 1 |

| | Evaluation Results | | | |
|---|---|---|---|---|
| | Wiring Width of 500 nm | | Wiring Width of 180 nm | |
| Ex. Nos. | Deposition Removability | Anti-corrosiveness | Deposition Removability | Anti-Corrosiveness |
| I-1 | ⊚ | ⊚ | ⊚ | ○ |
| I-2 | ⊚ | ⊚ | ⊚ | ○ |
| I-3 | ⊚ | ⊚ | ⊚ | ○ |
| I-4 | ⊚ | ⊚ | ⊚ | ○ |
| I-5 | ○ | ⊚ | ⊚ | ⊚ |
| I-6 | ○ | ⊚ | ○ | ⊚ |
| I-7 | ⊚ | ⊚ | ○ | ⊚ |
| I-8 | ⊚ | ⊚ | ⊚ | ⊚ |

TABLE 3-continued

| | | | | |
|---|---|---|---|---|
| I-9 | ◎ | ◎ | ◎ | ◎ |
| I-10 | ◎ | ◎ | ◎ | ◎ |
| I-11 | ◎ | ◎ | ◎ | ◎ |
| I-12 | ◎ | ○ | ◎ | ○ |
| I-13 | ◎ | ◎ | ◎ | ◎ |
| I-14 | ◎[4] | ◎[4] | ◎ | ◎ |
| I-15 | ◎[4] | ○[4] | ◎ | ○ |

[1] The numerical values described for dilution ratio are a value obtained through the use of water in the dilution, and "1" indicates one-fold dilution (stock solution) and "5" indicates 5-fold dilution.
[2] The pH was adjusted with an aqueous ammonia.
[3] The pH was adjusted with an amine.
[4] The evaluations for wirings having a wiring width of 500 nm in Examples I-14 and I-15 are both an evaluation of removability of deposition originated from interlayer film of a patterned wafer with holes.

TABLE 4

Remover Composition

| Comp. Ex. Nos. | Dissolution Agent (% by weight) | Inhibitor (% by weight) | Water % by weight | Other Additives (% by weight) | pH | Dilution Ratio[2] |
|---|---|---|---|---|---|---|
| I-1 | HEDP (0.2) | — | 99.8 | — | 1.8 | 1 |
| I-2 | Phosphonic Acid (0.2) | — | 99.8 | — | 1.2 | 1 |
| I-3 | — | Ammonium Sulfate (4.0) | 96.0 | — | 5.3 | 1 |
| I-4 | — | Ammonium Acetate (5.0) | 95.0 | — | 4.8 | 1 |
| I-5 | Boric Acid (0.5) | Ammonium Nitrate (5.0) | 94.5 | — | 5.6 | 1 |
| I-6 | LAS (0.5) | Ammonium Nitrate (5.0) | 94.5 | — | 5.6 | 1 |
| I-7 | Hydrochloric Acid (2.0) | Ammonium Phosphate (25.0) | 73.0 | — | 3.5 | 1 |
| I-8 | Hydrochloric Acid (2.0) | Ammonium Phosphate (25.0) | 73.0 | — | 3.5 | 5 |
| I-9[1] | Propionic Acid (5.0) | Tetramethylammonium Formate (5.0) | 41.9 | $NH_4F$ (8) DMF (40) EP120A (0.1) | 2.6 | 1 |
| I-10 | Propionic Acid (5.0) | Tetramethylammonium Formate (5.0) | 41.9 | $NH_4F$ (8) DMF (40) EP120A (0.1) | 2.6 | 1 |
| I-11 | Acetic Acid (10.0) | Sodium Polyoxyethylene Lauryl Ether Sulfate (10.0) | 80.0 | — | 3.6 | 1 |

Evaluation Results

| Ex. Nos. | Wiring Width of 500 nm | | Wiring Width of 180 nm | |
|---|---|---|---|---|
| | Deposition Removability | Anti-corrosiveness | Deposition Removability | Anti-Corrosiveness |
| I-1 | ◎ | Δ | ◎ | X |
| I-2 | ◎ | X | ◎ | X |
| I-3 | X | ◎ | Δ | ◎ |
| I-4 | X | ◎ | X | ◎ |
| I-5 | Δ | ◎ | Δ | ◎ |
| I-6 | X | ◎ | Δ | ◎ |
| I-7 | ◎ | Δ | ◎ | X |
| I-8 | ◎ | X | ◎ | X |
| I-9[1] | Δ | ○ | Δ | X |
| I-10 | ◎ | Δ | ◎ | X |
| I-11 | ○ | Δ | ○ | X |

[1] Immersing at 25° C. for 5 minutes
[2] The numerical values described for dilution ratio are a value obtained through the use of water in the dilution, and "1" indicates one-fold dilution (stock solution) and "5" indicates 5-fold dilution.

Incidentally, in the Tables,
HEDP represents 1-hydroxyethylidene-1,1-diphosphonic acid,
LAS represents dodecylbenzenesulfonic acid,
DMSO represents dimethylsulfoxide,
DMF represents dimethylformamide, and
EP120A represents a polyoxyethylene phenyl ether (manufactured by Dai-Ichi Kogyo Seiyaku Co., Ltd).

It can be seen from the results in Tables 3 and 4 that the remover compositions obtained in Examples I-1 to I-15 are all excellent in deposition removability and anticorrosiveness, and causes drastically suppressed corrosion even in wirings having such a narrow wiring width as 180 nm, as compared with those obtained in Comparative Examples I-1 to I-11. Also, it can be seen that the remover compositions obtained in Examples I-1 to I-15 have an excellent deposition removability even when the immersion time is as short as 15 minutes.

Examples II-1, II-2 and Comparative Examples II-1, II-2

II-1. Preparation of Remover Composition

Remover compositions having compositions (each numerical value: % by weight), shown in Table 5, were prepared and used for the evaluation.

TABLE 5

| | Acid | | | Inorganic Acid Salt and/or Organic Acid Salt | | | Water |
|---|---|---|---|---|---|---|---|
| | Kind | Solubility (g/100 g of water) | Amount (% by weight) | Kind | Solubility (g/100 g of water) | Amount (% by weight) | Amount (% by weight) |
| Ex. II-1 | Sulfuric Acid | 100 or more | 0.3 | Ammonium Nitrate | 100 or more | 5.0 | 94.7 |
| Ex. II-2 | Oxalic Acid | 11.6 | 0.2 | Ammonium Sulfate | 43.3 | 8.0 | 91.8 |
| Comp. Ex. II-1 | Acetic Acid | 100 or more | 0.5 | Ammonium Oxalate | 5.0 | 2.5 | 97.0 |
| Comp. Ex. II-2 | Benzoic Acid | 0.34 | 0.2 | Ammonium Chloride | 28.2 | 5.0 | 94.8 |

II-2. Wafer for Evaluation

Under the following conditions, patterned wafers with aluminum (Al) wirings respectively having a wiring width of 500 nm and 180 nm were cut into a 1-cm square piece, and the pieces were used for the cleaning test.
(Structure of Aluminum Wirings)
 TiN/Al—Si/TiN/Ti/SiO$_2$/Substrate II-3. Evaluation of Removability (1) Removing Method: A wafer for evaluation was immersed in 30 ml of a remover composition to perform removal at 40° C. for 15 minutes.
(2) Rinsing Method: The wafer for evaluation was immersed in 30 ml of ultrapure water at 25° C. for 1 minute, and this step was repeated twice to complete rinsing.
(3) Evaluation Method: The wafer for evaluation after rinsing was dried. Thereafter, the removability of deposition on aluminum wirings, and the corrosiveness were evaluated based on the following four ratings, using an FE-SEM (scanning electron microscope) at a magnification of 50,000 to 100,000.
(Removability of Deposition on Aluminum Wirings)
 ⊚: Remaining deposition is not confirmed at all.
 ○: A part of deposition remains.
 Δ: Substantial deposition remains.
 x: Deposition cannot be removed.
(Anticorrosiveness for Aluminum Wirings)
 ⊚: Corrosion of aluminum wirings is not confirmed at all.
 ○: There is partial corrosion of insulating materials.
 Δ: There is considerable corrosion of insulating materials.
 x: There is marked corrosion of insulating materials.
 Here, acceptable products are one rated as "⊚" or "○" for both of the removability of deposition on aluminum wirings and the anticorrosiveness for aluminum wirings.

II-4. Method of Evaluating Precipitates

One-hundred grams of a remover composition was placed in a 200-ml beaker, and left for 10 hours in an open system under stirring with a stirrer in a thermostat at 40° C. with the top opened. Thereafter, the beaker was taken out, and the presence or absence of precipitates was visually confirmed.

Incidentally, the aluminum oxide dissolution amount and the aluminum etching amount for the resulting remover composition were measured according to the above-mentioned standard tests (A-2) and (B-2).

The results are shown in Table 6.

TABLE 6

| | pH | Aluminum Oxide Dissolution Amount (ppm) | Aluminum Etching Amount (nm) | Wiring Width of 500 nm Deposition Removability | Wiring Width of 500 nm Corrosiveness for Aluminum Wirings | Wiring Width of 180 nm Deposition Removability | Wiring Width of 180 nm Corrosiveness for Aluminum Wirings | Precipitates After Circulation at 40° C. for 10 hours |
|---|---|---|---|---|---|---|---|---|
| Ex. II-1 | 2.1 | 21.3 | 2.6 | ⊚ | ⊚ | ⊚ | ⊚ | Absent |
| Ex. II-2 | 2.8 | 18.6 | 3.8 | ⊚ | ⊚ | ⊚ | ○ | Absent |
| Comp. Ex. II-1 | 3.1 | 8.7 | 5.8 | Δ | ○ | ○ | Δ | Present[1] |
| Comp. Ex. II-2 | 3.5 | 7.6 | 4.3 | Δ | ○ | Δ | ○ | Present[1] |

[1]White precipitates were formed on the liquid surface of the remover composition along the wall of the container.

It can be seen from the results in Tables 5 and 6 that the remover compositions obtained in Examples II-1 and II-2 are excellent in both of removability of deposition on aluminum wirings and anticorrosiveness, and are free from precipitates after storage for a long period of time, as compared with those obtained in Comparative Examples II-1 and II-2.

Particularly, it can be seen that the remover compositions of Examples II-1 and II-2 still exhibit an excellent deposition removability and anticorrosiveness for aluminum wirings having such a narrow wiring width as 180 nm.

Examples III-1 to III-3 and Comparative Examples III-1 to III-3

III-1. Remover Composition

Remover compositions having compositions, as shown in Table 7, were prepared and used for the evaluation.

TABLE 7

| | Aluminum Oxide Dissolution Agent | | Aluminum Corrosion Inhibitor | | Others | | Water | Aluminum Oxide Dissolution Amount | Aluminum Etching Amount |
|---|---|---|---|---|---|---|---|---|---|
| | Kind | Amount[1] | Kind | Amount[1] | Kind | Amount[1] | Amount[1] | (ppm) | (nm) |
| Ex. III-1 | HEDP | 0.3 | Ammonium Sulfate | 4.5 | — | — | 95.2 | 19.8 | 3.4 |
| Ex. III-2 | Oxalic Acid | 0.3 | Ammonium Nitrate | 5.0 | — | — | 94.7 | 20.2 | 5.6 |
| Ex. III-3 | Oxalic Acid | 0.5 | Ammonium Chloride | 8.0 | BDG | 3.0 | 88.5 | 21.8 | 3.8 |
| Comp. Ex. III-1 | Phosphoric Acid | 0.5 | — | — | — | — | 99.5 | 16.5 | 9.2 |
| Comp. Ex. III-2 | HEDP | 0.3 | — | — | — | — | 99.7 | 18.2 | 8.0 |
| Comp. Ex. III-3 | Oxalic Acid | 0.2 | — | — | BDG | 5.0 | 94.8 | 17.6 | 10.0 |

[1] % by weight

In the Table, HEDP and BDG represent 1-hydroxyethylidene-1,1-diphosphonic acid and butyl diglycol, respectively.

III-2. Standard Test (A-2) and Standard Test (B-2)

According to methods of the Standard Tests described above, aluminum oxide dissolution amount and aluminum etching amount were determined. The results are shown in Table 7.

III-3. Measurement of pH Change

The pH of the remover composition before raising the temperature in the above 1) of standard test (A-2) was determined at 25° C., which was defined as "initial" pH. Thereafter, the composition was centrifuged in 3) via the process of 2), and then the pH of the supernatant was measured, which was defined as pH "after standard test" (25° C.). The absolute value of these two values was defined as "amount of change" in pH, and the results are shown in Table 7.

III-4. Wafer for Evaluation

Under the following conditions, patterned wafers with aluminum (Al) wirings respectively having a wiring width of 0.5 µm (500 nm) and 0.18 µm (180 nm) were cut into a 1-cm square piece, and the pieces were used for the cleaning test.
(Structure of Aluminum Wirings)
  TiN/Al—Si/TiN/Ti/SiO$_2$/Substrate

III-5. Evaluation of Removability

1) Initial Removability (1) Removing Method: A wafer for evaluation was immersed in 30 ml of a remover composition to be subjected to a removal treatment at 40° C. for 15 minutes.

(2) Rinsing Method: The wafer for evaluation was immersed in 30 ml of ultrapure water at 25° C. for 1 minute, and this step was repeated twice to complete rinsing.

(3) Evaluation Method: The wafer for evaluation after rinsing was dried. Thereafter, the removability of deposition on aluminum wirings, and the anticorrosiveness were evaluated based on the following four ratings, using an FE-SEM (scanning electron microscope) at a magnification of 50,000 to 100,000.

2) Removability after Standard Tests (1) Removing Method: The wafer was immersed in 30 ml of a remover composition after the Standard Tests to perform removal at 40° C. for 15 minutes. The procedures of (2) and (3) were carried out in the same manner as in Initial Removability to evaluate removability of deposition on aluminum wirings and anticorrosiveness.

(Removability of Deposition on Aluminum Wirings)
  ⊚: Remaining deposition is not confirmed at all.
  ○: A part of deposition remains.
  Δ: Substantial deposition remains.
  ×: Deposition cannot be removed.

(Anticorrosiveness for Aluminum Wirings)
  ⊚: Corrosion of Al wirings is not confirmed at all.
  ○: There is partial corrosion of insulating materials.
  Δ: There is considerable corrosion of insulating materials.
  ×: There is marked corrosion of insulating materials.

Here, acceptable products are one rated as "⊚" or "○" for both of the removability of deposition on aluminum wirings and the anticorrosiveness for aluminum wirings. The results are shown in Table 8.

Also, when deposition on aluminum wirings produced during formation of semiconductor device and titanium-based deposition on the bottom of via holes are removed using the remover composition of Embodiment 2 described above, there is exhibited an effect that contaminations which largely

TABLE 8

| | pH | | | Wiring Width of 500 nm | | | |
|---|---|---|---|---|---|---|---|
| | | | | Initial | | After Standard Test | |
| | Initial | After Standard Test | Amount of Change | Deposition Removability | Corrosiveness for Aluminum Wirings | Deposition Removability | Corrosiveness for Aluminum Wirings |
| Ex. III-1 | 2.2 | 2.1 | 0.1 | ⊚ | ⊚ | ⊚ | ⊚ |
| Ex. III-2 | 1.9 | 1.7 | 0.2 | ⊚ | ⊚ | ⊚ | ○ |
| Ex. III-3 | 1.8 | 1.7 | 0.1 | ⊚ | ⊚ | ○ | ⊚ |
| Comp. Ex. III-1 | 2.1 | 1.1 | 1.0 | ⊚ | ○ | ⊚ | Δ |
| Comp. Ex. III-2 | 2.2 | 1.4 | 0.8 | ○ | ○ | ○ | Δ |
| Comp. Ex. III-3 | 1.8 | 1.1 | 0.9 | ⊚ | Δ | ○ | Δ |

| | Wiring Width of 180 nm | | | |
|---|---|---|---|---|
| | Initial | | After Standard Test | |
| | Deposition Removability | Corrosiveness for Aluminum Wirings | Deposition Removability | Corrosiveness for Aluminum Wirings |
| Ex. III-1 | ⊚ | ⊚ | ⊚ | ⊚ |
| Ex. III-2 | ⊚ | ○ | ○ | ○ |
| Ex. III-3 | ⊚ | ⊚ | ○ | ○ |
| Comp. Ex. III-1 | ⊚ | Δ | ⊚ | X |
| Comp. Ex. III-2 | ⊚ | Δ | ⊚ | X |
| Comp. Ex. III-3 | ⊚ | Δ | ⊚ | X |

It can be seen from the results in Table 8 that, in the cleaning methods using the remover compositions obtained in Examples III-1 to III-3, sufficient deposition removability and anticorrosiveness are retained after the standard tests which involve aluminum oxide dissolution simulating a continuous cleaning, and in particular, the corrosiveness is not lowered even for wirings having such a narrow wiring width as 180 nm, as compared with the methods using one obtained in Comparative Examples III-1 to III-3.

INDUSTRIAL APPLICABILITY

In the present invention, the removal cleaning method of Embodiment 1 described above provides excellent removability of deposition on aluminum wirings produced during the formation of semiconductor device and titanium-based deposition on the bottom of via holes, and also excellent anticorrosiveness without causing etching of the materials of metal wirings having a narrow wiring width. Therefore, by using the removal cleaning method of Embodiment 1 described above, there are exhibited effects that higher-speed and higher integration in semiconductor devices can be realized, and that high quality electronic parts such as LCDs, memories and CPUs can be produced.

Also, when deposition on aluminum wirings produced during formation of semiconductor device and titanium-based deposition on the bottom of via holes are removed using the remover composition of Embodiment 2 described above, there is exhibited an effect that contaminations which largely affect the quality of semiconductor, such as electric properties, can be prevented.

Also, by using the remover composition of Embodiment 3 described above in a step of removal cleaning semiconductor for removing deposition on aluminum wirings produced during formation of semiconductor device and titanium-based deposition on the bottom of via holes, there can be prevented remaining deposition and corrosion of wirings, which largely affect the quality of semiconductor. Also, semiconductors can be continuously cleaned for a long period of time, without adding or replacing with a fresh remover, so that there is an effect that the productivity for semiconductor is increased and high-performance electronic parts such as LCDs, memories and CPUs can be economically produced.

Therefore, the removal cleaning method of the present invention can be applied to the production of even higher-speed, even more highly integrated and high quality electronic parts such as LCDs, memories and CPUs.

Also, the remover composition of the present invention can be suitably used for production of smaller-sized and higher-performance electronic parts such as LCDs, memories and CPUs, and particularly for cleaning a semiconductor substrate or a semiconductor device having wiring materials containing aluminum and/or titanium.

It is apparent that there are many equivalents to the present invention described above. Such equivalents are not regarded as departing from the spirit and scope of the invention, and all the modifications obvious to a person skilled in the art are within the technical scope of the appended claims.

What is claimed is:

1. A removal cleaning method for a semiconductor substrate or a semiconductor device with metal wirings, comprising the steps of:
   forming a thin film on said semiconductor substrate or said semiconductor device with metal wirings;
   forming a predetermined resist pattern on said thin film by lithography;
   etching said semiconductor substrate or said semiconductor device with metal wirings to selectively remove said thin film based on said predetermined pattern;
   ashing said semiconductor substrate or said semiconductor device with metal wirings to remove said resist;
   applying a remover composition to remove a remaining deposition on said semiconductor substrate or said semiconductor device with metal wirings,
   wherein the remover composition comprises a dissolution agent having an alumina dissolution amount as measured according to the standard test (A-1) of 10 ppm or more, and an inhibitor having an aluminum etching amount as measured according to the standard test (B-1) of 7 nm or less, and the remover composition substantially does not contain a fluorine-containing compound; and
   wherein said inhibitor is at least one selected from the group consisting of ammonium sulfate, tetramethylammonium sulfate, methylethanolamine sulfate, methyldiethanolamine sulfate, and ammonium chloride.

2. The removal cleaning method for a semiconductor substrate or a semiconductor device according to claim 1, wherein the dissolution agent is an acid.

3. The removal cleaning method for a semiconductor substrate or a semiconductor device according to claim 1, wherein a weight ratio of the dissolution agent to the inhibitor (dissolution agent/inhibitor) is 2/1 to 1/30.

4. The removal cleaning method for a semiconductor substrate or a semiconductor device according to claim 1, wherein the remover composition comprises 50% by weight or more of water and has a pH of 1 to 10.

5. The removal cleaning method for a semiconductor substrate or a semiconductor device according to claim 1, wherein the metal wirings comprise aluminum wirings having a wiring width of 180 nm or less.

6. A removal cleaning method for a semiconductor substrate or a semiconductor device with metal wirings having a wiring width of 180 nm or less, comprising the steps of:
   forming a thin film on said semiconductor substrate or said semiconductor device with metal wirings;
   forming a predetermined resist pattern on said thin film by lithography;
   etching said semiconductor substrate or said semiconductor device with metal wirings to selectively remove said thin film based on said predetermined pattern;
   aching said semiconductor substrate or said semiconductor device with metal wirings to remove said resist;
   applying a remover composition to remove a remaining deposition on said semiconductor substrate or said semiconductor device with metal wirings,
   wherein the remover composition comprises a dissolution agent having an alumina dissolution amount as measured according to the standard test (A-1) of 10 ppm or more, and an inhibitor having an aluminum etching amount as measured according to the standard test (B-1) of 7 nm or less; and
   wherein said inhibitor is at least one selected from the group consisting of ammonium sulfate, tetramethylammonium sulfate, methylethanolamine sulfate, methyldiethanolamine sulfate, and ammonium chloride.

7. The removal cleaning method for a semiconductor substrate or a semiconductor device according to claim 1, wherein the metal wirings are metal wirings comprising one or more metals selected from the group consisting of aluminum, copper, tungsten and titanium.

8. A method of producing a semiconductor substrate or a semiconductor device, comprising the step involving the removal cleaning method for a semiconductor substrate or a semiconductor device as defined in claim 1.

9. A method of cleaning a semiconductor, comprising the step of:
   forming a thin film on said semiconductor;
   forming a predetermined resist pattern on said thin film by lithography;
   etching said semiconductor to selectively remove said thin film based on said predetermined pattern;
   ashing said semiconductor to remove said resist;
   applying a remover composition to remove a remaining deposition on said semiconductor,
   wherein said remover composition comprises a) water, and b) a compound having a solubility (25° C.) in water of 10 g or more/100 g of water, wherein the content of the water a) is 50 to 99.8% by weight, and the content of the compound b) is 90% by weight or more of the portion of the remover composition excluding the water a), and the remover composition has an aluminum oxide dissolution amount as measured according to the standard test (A-2) of 10 ppm or more, and an aluminum etching amount as measured according to the standard test (B-2) of 7 nm or less; and
   wherein the remover composition further comprises an inhibitor that is at least one selected from the group consisting of ammonium sulfate, tetramethylammonium sulfate, methylethanolamine sulfate, methyldiethanolamine sulfate, and ammonium chloride.

10. The method of cleaning a semiconductor according to claim 9, wherein the semiconductor is a semiconductor with aluminum wirings having a wiring width of 180 nm or less.

11. A method of producing a semiconductor, comprising the step of cleaning using the cleaning method as defined in claim 9.

12. A method of continuous cleaning of a semiconductor, comprising the steps of:
   forming a thin film on said semiconductor;
   forming a predetermined resist pattern on said thin film by lithography;
   etching said semiconductor to selectively remove said thin film based on said predetermined pattern;
   ashing said semiconductor to remove said resist;
   cleaning at 60° C. or lower, by using a water-based remover composition to remove a remaining deposition on said semiconductor, comprising an aluminum oxide dissolution agent and an aluminum corrosion inhibitor, wherein the water-based remover composition has: 1) a water content of 50% by weight or more; 2) an aluminum oxide dissolution amount as measured according to the standard test (A-2) of 10 ppm or more; 3) an aluminum etching amount as measured according to the standard test (B-2) of 7 nm or less; and provides 4) a pH change before and after the standard test (A-2) of 0.5 or less; and wherein said aluminum corrosion inhibitor is at least one selected from the group consisting of ammonium sulfate, tetramethylammonium sulfate, methylethanolamine sulfate, methyldiethanolamine sulfate, and ammonium chloride.

13. The method of continuous cleaning of a semiconductor according to claim 12, wherein a semiconductor substrate or a semiconductor device with aluminum wirings having a wiring width of 180 nm or less is used.

14. A method of producing a semiconductor, comprising the step of cleaning using the method of continuous cleaning as defined in claim 12.

15. The removal cleaning method for a semiconductor substrate or a semiconductor device according to claim 1, wherein the dissolution agent is one or more acids selected from the group consisting of phosphonic acid, sulfuric acid, nitric acid, phosphoric acid, hydrochloric acid, organic phosphonic acid, organic sulfuric acid, carboxylic acid, and organic sulfonic acid.

16. The removal cleaning method for a semiconductor substrate or a semiconductor device according to claim 6, wherein the dissolution agent is one or more acids selected from the group consisting of phosphonic acid, sulfuric acid, nitric acid, phosphoric acid, hydrochloric acid, organic phosphonic acid, organic sulfuric acid, carboxylic acid, and organic sulfonic acid.

17. The method of continuous cleaning of a semiconductor according to claim 12, wherein the aluminum oxide dissolution agent is one or more acids selected from the group consisting of phosphonic acid, sulfuric acid, nitric acid, phosphoric acid, hydrochloric acid, organic phosphonic acid, organic sulfuric acid, carboxylic acid, and organic sulfonic acid.

* * * * *